United States Patent [19]

Sullivan

[11] 4,053,294
[45] Oct. 11, 1977

[54] LOW STRESS SEMICONDUCTOR WAFER CARRIER AND METHOD OF MANUFACTURE

[75] Inventor: John E. Sullivan, Santa Clara, Calif.

[73] Assignee: California Quartzware Corporation, Santa Clara, Calif.

[21] Appl. No.: 687,672

[22] Filed: May 19, 1976

[51] Int. Cl.² ............................................. C03B 23/20
[52] U.S. Cl. ........................................ 65/56; 65/62; 29/417; 432/258; 432/259
[58] Field of Search ............... 65/36, 54, 55, 56, 62; 432/258, 259; 29/417

[56] References Cited

U.S. PATENT DOCUMENTS

| 1,999,770 | 4/1935 | Littleton | 65/36 |
| 3,877,134 | 4/1975 | Shanahan | 29/417 |
| 3,998,333 | 12/1976 | Kamada | 432/258 |

FOREIGN PATENT DOCUMENTS

| 539,728 | 2/1956 | Italy | 432/259 |

*Primary Examiner*—Arthur D. Kellogg
*Attorney, Agent, or Firm*—Flehr, Hohbach, Test

[57] ABSTRACT

A semiconductor boat or carrier fabricated of stress relieved quartz bar having a rectangular cross section. The carrier has parallel elongate side bars and a parallel elongate lower bar, all of which are joined at the ends thereof by transverse lengths of quartz bar also having rectangular cross section. Spaced slots are formed in the inwardly facing edges of the elongate side and bottom bars so that groups of three slots, one in each bar, lie in parallel planes for receiving semiconductor wafers in three point contact in the carrier. End bars attached to and extending between the side bars and central bars extending between each of the side bars and the bottom bar are provided for obtaining rigidity in the carrier. These end and central bars are also rectangular in cross section. The method includes stress relieving a quartz billet, cutting the quartz billet into elongate quartz bars having rectangular cross section, welding the elongate bars in spaced parallel relation to form an open ended cradle and plunge cutting spaced slots simultaneously in both side bars and the bottom bar. Subsequent attachment of end bars extending between the ends of the side bars provides rigidity.

3 Claims, 9 Drawing Figures

LOW STRESS SEMICONDUCTOR WAFER CARRIER AND METHOD OF MANUFACTURE

BACKGROUND OF THE INVENTION

The present invention relates to a carrier for semiconductor wafers and the method of manufacture of the carrier and more particularly to such a carrier for use in elevated temperature processing of semiconductor wafers.

In the formation of semiconductor "boats" or carriers for use in high temperature semiconductor processing, round quartz rod has been used almost exclusively in the past. Whenever square rod was utilized the boat or carrier proved to be relatively expensive since the square rod was necessarily machined from larger quartz billets. Round quartz rod is extruded and since it is hot formed contains considerable internal stress in the round rod shape. Consequently, when "boats" are fabricated of round or square rod, if internal stress is present in the rod, deformation of the carrier takes place during high temperature processing of the carried semiconductor wafers and the carrier is useful only for a limited number of such processes. The deformation causes uncontrolled internal stress to be imposed upon the carried semiconductor wafers with consequent adverse effects upon the operating characteristics of the processed semiconductor elements.

A semiconductor wafer carrier or semiconductor boat is desirable which has a long life in terms of the number of elevated temperature processes to which it may be exposed and which is rigid at elevated temperatures exhibiting minimal dimensional change due to plasticity or "sag" at high temperature or due to relief of internal stress in the component parts of the carrier.

SUMMARY AND OBJECTS OF THE INVENTION

A carrier for semiconductor wafers is disclosed which is useful in diffusion processes at elevated temperatures and includes elongate parallel quartz side bars having a rectangular cross section. An elongate quartz bottom bar which is parallel to the side bars and displaced from the plane containing the side bars also has rectangular cross section. Lengths of rectangular cross section quartz bars are attached to and extend between the ends of the parallel bars for providing rigidity of the assembly. A plurality of slots are formed on the inwardly facing edges of the side bars and the bottom bar so that each one of the slots in the bottom bar is in a common plane with a slot in each of the side bars. The slots are adapted to receive the edges of a planar semiconductor wafer so that a plurality of wafers may be carried in spaced parallel relation.

The method includes heat relieving a quartz billet and subsequently submerging the billet in a liquid for cutting in a submerged condition to obtain a series of plates from a first cut and a series of elongate rectangular cross section bars from a second cut. The elongate bars are fastened together such that two of the bars are located in spaced parallel relation in one plane and another of the bars is located parallel thereto in a plane displaced from the one plane. The three parallel bars are fixed in this relative position by welding portions of the square cross section quartz bar between the ends of each of the two elongate bars and the end of the bar lying in the displaced plane. A plurality of slots is cut simultaneously on the inwardly facing edges of the three parallel elongate bars so that groups of three of the slots are in parallel planes transverse to the parallel elongate bars. Lengths of the rectangular cross section bar are welded between the ends of the two bars in the common plane to provide rigidity in the carrier at elevated temperatures. The slots are adapted to receive the edges of a semiconductor wafer so that a series of wafers may be carried in spaced parallel relationship therein.

It is an object of the present invention to provide a semiconductor wafer carrier which is free of internal stress and therefore does not impart stress to the carried wafers during elevated temperature processing.

It is another object of the present invention to provide a semiconductor wafer carrier which is capable of performing the carrying function through a large number of elevated temperature processes.

It is another object of the present invention to provide a semiconductor wafer carrier with structural members for increasing turbulence of gas flow in a diffusion process to improve diffusion uniformity.

It is another object of the present invention to provide a semiconductor wafer carrier which does not sag or change dimensional characteristics during elevated temperature processing.

It is another object of the present invention to provide a semiconductor wafer carrier which reduces the imposition of stress on carried wafers due to heat distortion in the carrier during high temperature processing.

Additional objects and features of the invention will appear from the following description in which the preferred embodiments of the invention have been set forth in detail in conjunction with the accompanying drawings.

DESCRIPTION OF THE PREFERRED EMBODIMENTS

Figure 1:
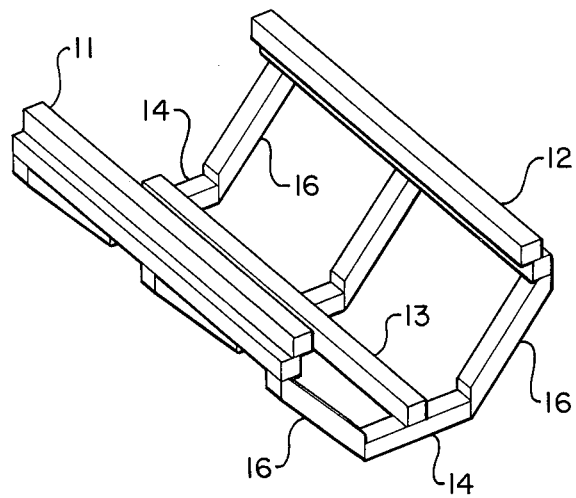
FIG. 1 is an isometric view of a subassembly of the disclosed carrier.

FIG. 1 shows a subassembly of a semiconductor "boat" or semiconductor wafer carrier having first and second elongate side members 11 and 12 extending in spaced parallel relation and in a common plane. An elongate bottom bar 13 is shown which is parallel to side bars 11 and 12, but displaced from the plane containing side bars 11 and 12. A bottom end bar 14 is attached to extends across each end of bottom bar 13 and sloping end bars 16 extend between the ends of bottom end bars 14 and the ends of each of the elongate side bars 11 and 12. All of the quartz bar utilized in the fabrication of the subassembly of FIG. 1 is rectangular in cross section and attachment points are made by heat welding to fuse the attachment points.

Figure 2:
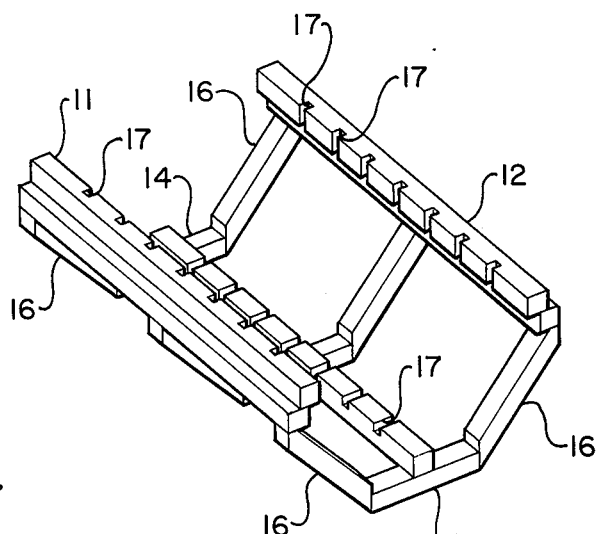
FIG. 2 is an isometric view of a higher subassembly of the disclosed carrier.

FIG. 2 shows the open ended cradle configuration of FIG. 1 with a plurality of slots 17 formed in the inwardly facing edges of side bars 11 and 12 and bottom bar 13. Slots 17 are formed simultaneously in the parallel side bars 11 and 12 and bottom bar 13 so that each spaced slot 17 in bottom bar 13 is coplanar with a slot in each of elongate side bars 11 and 12. In this fashion, groups of three slots 17 lie in spaced parallel planes extending transversely to side bars 11 and 12 and bottom bar 13.

Figure 3:
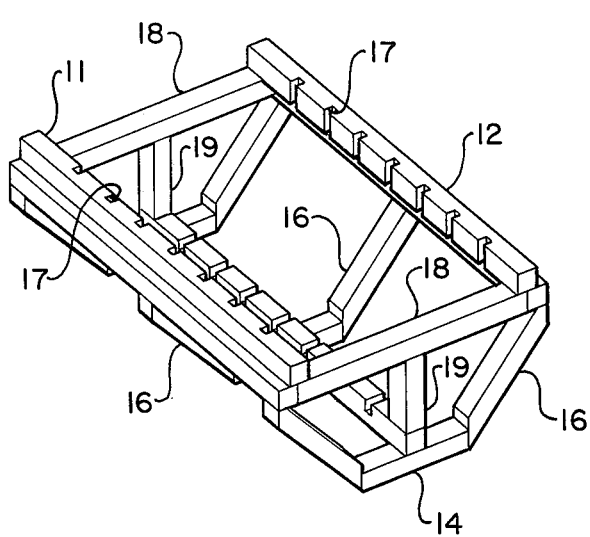
FIG. 3 is an isometric view of the completed assembly evolving from the subassemblies of FIGS. 1 and 2.

Turning now to FIG. 3, upper end bars 18 are shown attached to and extending between the ends of elongate side bars 11 and 12. A vertical end bar 19 may be attached to and extend between the central portions of upper end bar 18 and bottom end bar 14. A completed semiconductor wafer carrier is seen in FIG. 3 for engaging the edges of a semiconductor wafer in slots 17 in three point contact for carrying the wafers during elevated temperature semiconductor processing.

Figure 7:
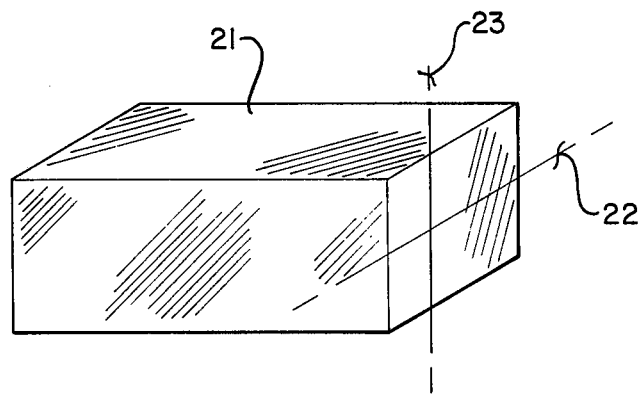
FIG. 7 is an isometric view of a quartz billet.

The method by which the semiconductor wafer carrier of FIGS. 1 through 3 is fabricated is as follows. FIG. 7 shows a typical quartz billet 21 which contains considerable internal stress as manufactured. Quartz billet 21 is stress relieved through an appropriate heat treating program. Such a program for relieving internal stress in billet 21 includes sustaining the billet at 1500° centigrade for a period of four hours. Thereafter the temperature is reduced at a rate of 50° centigrade per hour to a level of 900° centigrade. Air cooling of billet 21 is accomplished from 900° centigrade to room temperature.

Figure 8:
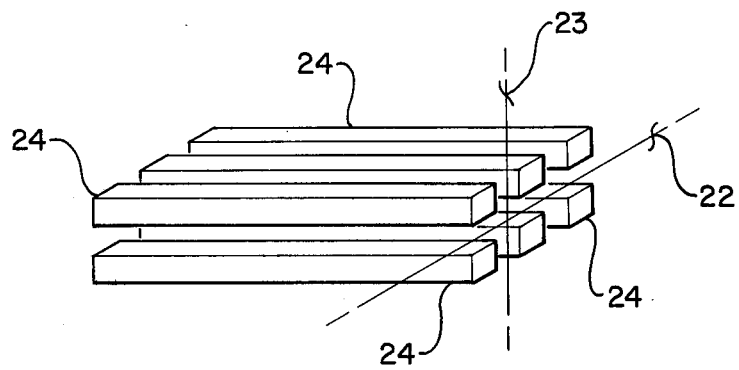
FIG. 8 is an isometric view of rectangular cross section bars cut from the quartz billet.

Subsequent to heat relief of internal stress in quartz billet 21, a series of elongate bars having rectangular cross section is obtained by sawing quartz billet 21 first in one direction 22, as seen in FIG. 8 and subsequently in a direction 23 orthogonal to direction 22. A plurality of elongate quartz bars 24 having elongate cross sections are produced. Quartz bars 24 are used for the elongate side and bottom bars and all of the transverse end bars seen in FIGS. 1 through 3. Elongate side bars 11 and 12 are joined to the contacting end bar sections by a heat welding process which may be a hydrogen-/oxygen flame weld with a quartz welding rod or without welding rod. Only a brief exposure of the welding joints to the welding heat is required.

Carbon jigs are used to lay out the elongate side bars 11 and 12 and the elongate bottom bar 13 while the lateral end members such as bottom end bar 14 and sloping end bars 16 are attached thereto by welding. While the subassembly is in this open ended cradle form a plunge cut by a gang of spaced saw blades simultaneously forms slots 17 in side bars 11 and 12 and bottom bar 13, so that groups of three slots 17 therein lie in a series of parallel planes extending transverse to the side bars and bottom bar. Subsequent to the formation of slots 17, upper end bars 18 and vertical end bars 19, if necessary, are welded in place as shown in FIG. 3.

Figure 4:
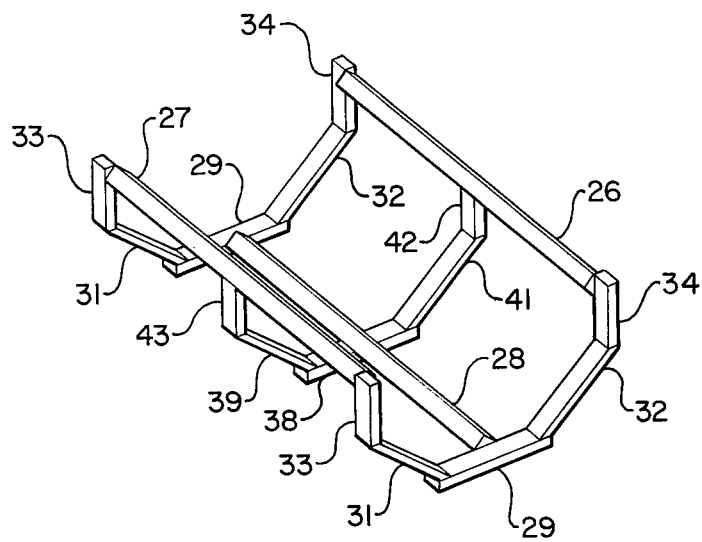
FIG. 4 is an isometric view of a subassembly of an alternate embodiment of the present invention.

Turning now to FIG. 4 an alternate embodiment of the semiconductor wafer carrier is shown having first and second elongate parallel side bars 26 and 27 lying in a common plane. A bottom bar 28 extends parallel to first and second side bars 26 and 27 spaced from the common plane. First and second side bars 26 and 37 and bottom bar 28 are oriented so that one corner of the rectangular cross section is inwardly facing as shown. A bottom end bar 29 is attached to and extends across the ends of bottom bar 28 and sloping end bars 31 and 32 extend upwardly to contact vertical side bars 33 and 34. Sloping end bar 31 is joined to vertical side bar 33 and sloping end bar 32 is joined to vertical side bar 34 at their points of contact by the heat welding process described above. The ends of first side bar 26 are joined to the upper end of vertical side bar 34 and the ends of second side bar 27 are joined to the upper ends of vertical side bar 33 also by the heat welding process described above.

Figure 5:
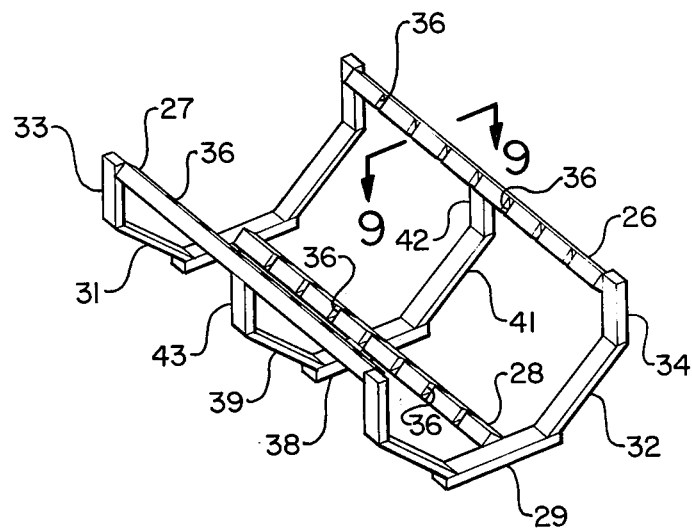
FIG. 5 is an isometric view of a higher subassembly of the alternate embodiment of FIG. 4.

Turning now to FIG. 5, a plurality of slots 36 are formed on the inwardly facing corners of first and second side bars 26 and 27 and bottom bar 28 in spaced relation therealong, so that groups of three of slots 36 lie in a common plane. In this fashion, a series of planar semiconductor wafers may be carried in three point contact at the edges thereof by slots 36 in spaced parallel relation in the carrier.

Figure 6:
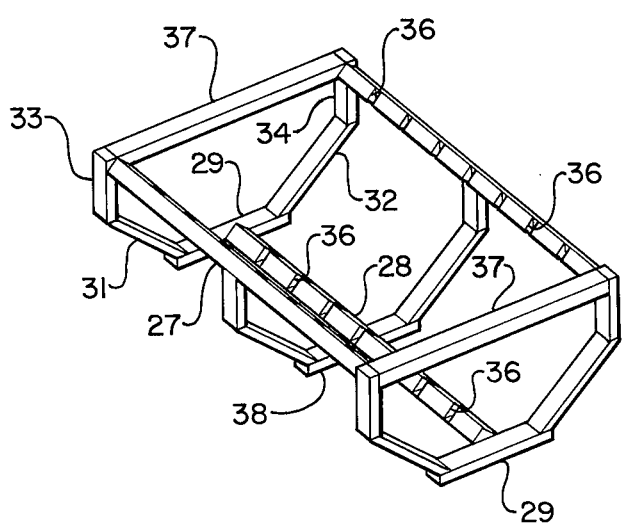
FIG. 6 is an isometric view of the completed assembly of the alternate embodiment of FIGS. 4 and 5.

Turning to FIG. 6, an upper end bar 36 is shown attached to and extending between the ends of first and second side bars 26 and 27 to provide rigidity for the carrier. If desired for additional rigidity in the carrier a central bottom bar 38 may be attached to and extending across the central portion of bottom bar 28. In the same fashion as shown at the ends of the carrier in FIG. 5, a pair of sloping central bars 39 and 41 are attached to the ends of central bottom bar 38. A pair of central vertical bars 42 and 43 are shown attached to and extending between the central portion of first and second side bars 26 and 27 respectively and the upper end of central sloping bars 39 and 41 respectively. All of the quartz bar members utilized in the embodiment of FIGS. 4 through 6 are rectangular in cross section and substantially free of internal stress having undergone the stress relief process described above.

Figure 9:
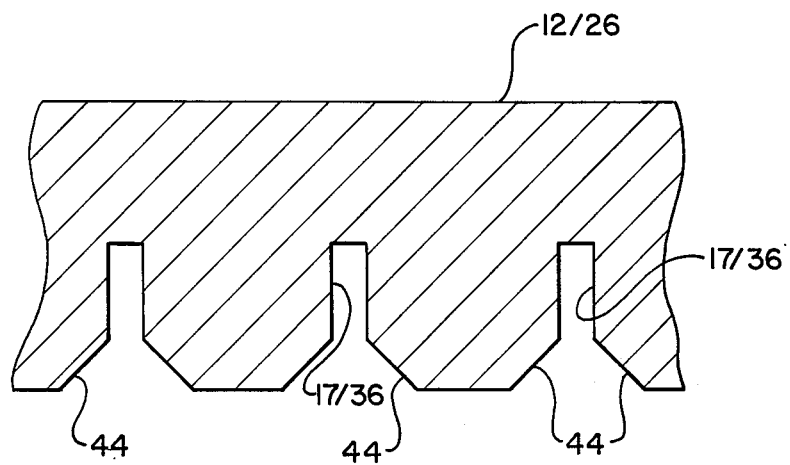
FIG. 9 is a sectional view along the lines 9—9 of FIG. 5.

Referring now to FIG. 9, the slot detail for slots 36 and 17 is shown. The slots have a width for accepting a predetermined thickness of semiconductor wafer and have beveled slot edges 44 for facilitating the entry of the edges of the semiconductor wafers into slots 17 or 36.

A semiconductor wafer carrier has been disclosed which is fabricated from rectangular cross section stress relieved quartz bar. The rectangular cross section of the bar induces turbulence in gas passing thereby so that diffusion processes at elevated temperatures for semiconductor wafers are enhanced by the additional turbulence resulting from the effects of the rectangular cross section bar material in the semiconductor carrier. Moreover, the lack of internal stress in the bar material from which the "boat" or carrier is fabricated prevents imposition of stress in the carried semiconductor wafers during elevated temperature processing as there is no tendency for the quartz bar to move dimensionally as internal stress is relieved at high temperatures. The rigidity of the carriers is enhanced by the rectangular cross section bar material used in the construction and by the additional central and/or end members welded into the assemblies for that purpose.

What is claimed is
1. A method of fabricating a dimensionally stable carrier for planar semiconductor wafers during high temperature wafer processing, comprising the steps of stress relieving a raw quartz billet, cutting the quartz billet into elongate bars having rectangular cross section, welding the elongate bars in spaced parallel relation to a cross memeber therebetween at each end thereof, so that an open ended cradle is formed with two side bars and one bottom bar, cutting a plurality of inwardly facing transverse slots simultaneously in the side bars and bottom bar, whereby groups of three of the transverse slots lie in parallel planes adapted to receive the edges of the wafers for three point suspension thereof, and welding lengths of the elongate bars across the open ends of the cradle thereby reinforcing the carrier structure, whereby dimensional shift in the assembled elongate bars at high temperature due to bar internal stress relief is reduced.

2. A method of fabricating a high temperature semiconductor wafer carrier comprising the steps of heat treating a raw quartz billet to remove internal stress therefrom, submerging the stress relieved billet in a cooling liquid, cutting the submerged stress relieved billet into elongate bars having rectangular cross section, aligning two of the elongate bars in spaced parallel relation in one plane and another of the elongate bars parallel to the two bars displaced from the one plane, fixing the three parallel bars in relative position by welding portions of the elongate bars between the ends of each of the two elongate bars and the end of the other elongate bar, cutting simultaneously a plurality of slots adapted to receive the edges of the wafer on the inwardly facing portions of the parallel elongate bars so that groups of three of the slots are in parallel planes transverse to the parallel elongate bars, and welding lengths of the elongate bar between the ends of the two bars in the one plane, thereby providing rigidity in the carrier and dimensional stability at elevated temperatures.

3. The method of claim 2 together with the step of welding lengths of the elongate bar between a central location on each of the two elongate bars in one plane and the central location on the other elongate bar, whereby additional rigidity is obtained and susceptibility to "sag" at elevated temperature is reduced.

* * * * *